(12) United States Patent
Hosokawa et al.

(10) Patent No.: US 10,270,015 B1
(45) Date of Patent: Apr. 23, 2019

(54) LIGHT-EMITTING DEVICE

(71) Applicant: NICHIA CORPORATION, Anan-shi, Tokushima (JP)

(72) Inventors: Shoji Hosokawa, Tokushima (JP); Kazuya Nishimata, Anan (JP); Tomokazu Yoshida, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 16/201,141

(22) Filed: Nov. 27, 2018

Related U.S. Application Data

(63) Continuation-in-part of application No. 15/866,826, filed on Jan. 10, 2018, now Pat. No. 10,162,216.

(30) Foreign Application Priority Data

Jan. 13, 2017 (JP) ................... 2017-004424

(51) Int. Cl.
*C09K 11/08* (2006.01)
*C09K 11/64* (2006.01)
(Continued)

(52) U.S. Cl.
CPC ........ *H01L 33/504* (2013.01); *C09K 11/0883* (2013.01); *C09K 11/643* (2013.01); *C09K 11/7731* (2013.01); *C09K 11/7734* (2013.01); *G02F 1/1336* (2013.01); *H01L 33/507* (2013.01); *H01L 33/508* (2013.01); *H01L 33/486* (2013.01)

(58) Field of Classification Search
CPC .... H01L 33/504; H01L 33/507–33/508; H01L 33/486; H01L 33/50; C09K 11/643; C09K 11/7731; C09K 11/0883; C09K 11/7734; C09K 11/08; C09K 11/02; G06F 1/1336; G06F 1/133602; G06F 1/133514; F21K 2099/005
See application file for complete search history.

(56) References Cited

U.S. PATENT DOCUMENTS 6,380,669 B1    4/2002   Zachau
2002/0063301 A1  5/2002   Hanamoto
(Continued)

FOREIGN PATENT DOCUMENTS

JP   2004-327492 A   11/2004
JP   2005068403 A    3/2005
(Continued)

*Primary Examiner* — Joseph L Williams
*Assistant Examiner* — Jose M Diaz
(74) *Attorney, Agent, or Firm* — Hunton Andrews Kurth LLP

(57) ABSTRACT

Provided is a light-emitting device including a light-emitting element having a peak emission wavelength in a range of from 400 nm to 470 nm, and a fluorescent member including a first fluorescent material including an aluminate that contains Mg, Mn, and at least one alkali earth metal selected from the group consisting of Ba, Sr, and Ca, a second fluorescent material having a different composition from the first fluorescent material, and a third fluorescent material. The first, second and third fluorescent materials have a peak emission wavelength in a range of from 510 nm to 525 nm, from 510 nm to 550 nm, and from 620 nm to 670 nm, respectively.

11 Claims, 5 Drawing Sheets

(51) Int. Cl.
  *C09K 11/77* (2006.01)
  *H01L 33/48* (2010.01)
  *H01L 33/50* (2010.01)
  *G02F 1/13357* (2006.01)

(56) References Cited

U.S. PATENT DOCUMENTS

| | | |
|---|---|---|
| 2004/0207313 A1 | 10/2004 | Omoto et al. |
| 2005/0023955 A1 | 2/2005 | Otsuka |
| 2006/0226759 A1 | 10/2006 | Masuda et al. |
| 2009/0146549 A1* | 6/2009 | Kimura .............. C09K 11/7734 313/503 |
| 2010/0132789 A1 | 6/2010 | Huang |
| 2010/0213821 A1 | 8/2010 | Masuda et al. |
| 2010/0277054 A1 | 11/2010 | Takashima |
| 2011/0031874 A1 | 2/2011 | Hosokawa et al. |
| 2013/0043430 A1 | 2/2013 | Nakamura |
| 2013/0285104 A1 | 10/2013 | Yoshimura |
| 2014/0225145 A1 | 8/2014 | Masuda et al. |
| 2014/0273246 A1 | 9/2014 | Bisso |
| 2016/0104824 A1 | 4/2016 | Furuyama |
| 2016/0141465 A1 | 5/2016 | Masuda et al. |
| 2017/0283694 A1 | 10/2017 | Masuda et al. |
| 2017/0315389 A1 | 11/2017 | Chu |

FOREIGN PATENT DOCUMENTS

| | | |
|---|---|---|
| JP | 2007049114 A | 2/2007 |
| JP | 2008-303331 A | 12/2008 |
| WO | 2009093427 A1 | 7/2009 |

* cited by examiner

US 10,270,015 B1

LIGHT-EMITTING DEVICE

CROSS-REFERENCE TO RELATED APPLICATIONS

This is a continuation-in-part application of U.S. patent application Ser. No. 15/866,826, filed Jan. 10, 2018 which claims priority to Japanese Patent Application No. 2017-004424, filed on Jan. 13, 2017, the disclosures of which are hereby incorporated by reference in their entirety.

BACKGROUND

Technical Field

This disclosure relates to a light-emitting device.

Description of the Related Art

A light-emitting device known in the art may include a blue light-emitting diode (LED) in combination with a green light-emitting fluorescent material and a red light-emitting fluorescent material excited by the blue light to emit white-based mixed light. A light-emitting device included in an image display device, such as a liquid crystal display, is required to have a high luminous flux and reproduce colors in a wide range of chromaticity coordinates. The evaluation standard for color reproducibility is, for example, National Television System Committee (NTSC) ratio standardized by NTSC.

For example, Japanese Patent Application Publication No. 2008-303331 describes a light-emitting device for use in a liquid crystal display that is required to have a color reproducibility of 95% or more in NTSC ratio. The light-emitting device includes a light-emitting element having a peak emission wavelength in a range of from 390 nm to 550 nm, a green light-emitting β sialon fluorescent material, and a red light-emitting fluorescent material represented, for example, by $CaAlSiN_3$:Eu.

SUMMARY

A light-emitting device includes a light-emitting element and a fluorescent member. The light-emitting element has a peak emission wavelength in a range of from 400 nm to 470 nm. The fluorescent member includes a first fluorescent material, a second fluorescent material, and a third fluorescent material. The first fluorescent material includes an aluminate containing Mg, Mn, and at least one alkali earth metal selected from the group consisting of Ba, Sr, and Ca, and has a peak emission wavelength in a range of from 510 nm to 525 nm. The second fluorescent material has a different composition from the first fluorescent material, and a peak emission wavelength in a range of from 510 nm to 550 nm. The third fluorescent material has a peak emission wavelength in a range of from 620 nm to 670 nm.

DETAILED DESCRIPTION

Figure 1:
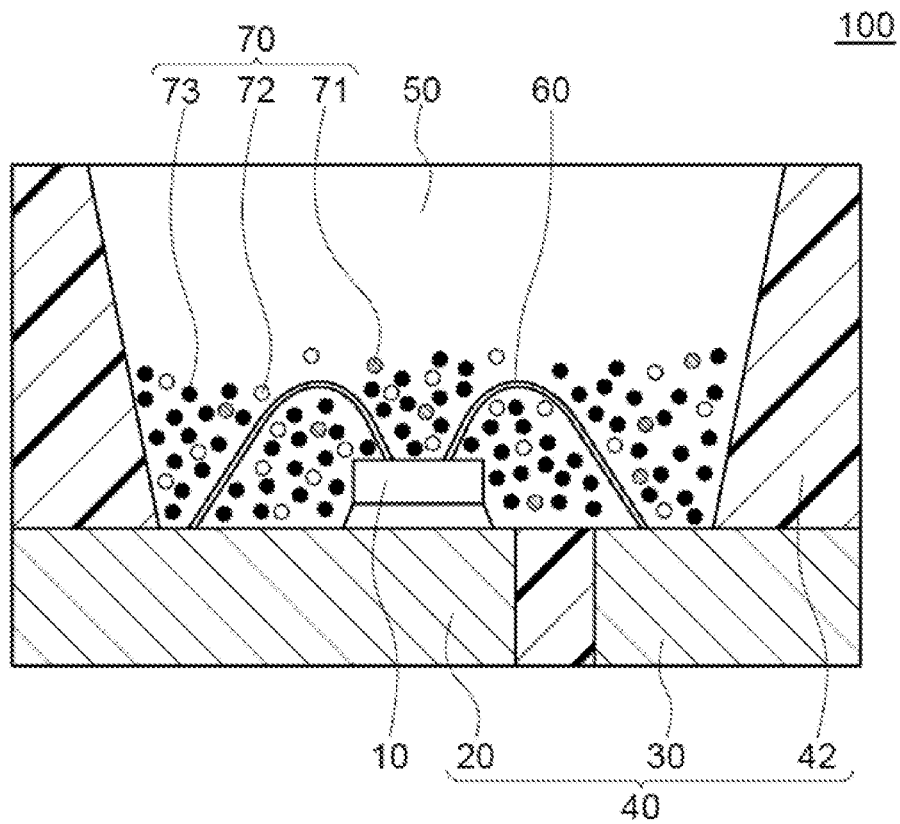
FIG. 1 is a schematic cross-sectional view of an exemplary light-emitting device according to the present disclosure.

A liquid crystal display includes color filters each for transmitting red light, green light, or blue light. The filters transmit a part of light emitted from a light-emitting device and combine three primary colors of light: red, green, and blue to represent color. Thus, a light-emitting device having an emission peak with a narrow half bandwidth in each of the wavelength regions of red, green, and blue in the emission spectrum has high color purity in each wavelength region, resulting in improved color reproducibility.

The β sialon fluorescent material described in JPA No. 2008-303331 has a relatively wide half bandwidth of the emission spectrum, and a peak emission wavelength at a relatively long wavelength. With regard to visibility, the β sialon fluorescent material has a part of its emission spectrum in the wavelength range that contributes to improving luminance, and has relatively more light-emitting components in that wavelength range than other fluorescent materials known in the art. Thus, the β sialon fluorescent material of Patent Literature 1 is more luminous than other fluorescent materials known in the art. However, as the emission spectrum has a relatively wide half bandwidth, the β sialon fluorescent material of Patent Literature 1 has a low green color purity. This can limit further expansion of the color reproduction range of a liquid crystal display including the light-emitting device. Thus, there is a need for an improved light-emitting device including a β sialon fluorescent material and having higher luminance and a wider color reproduction range for use as a light source for a high-definition liquid crystal display.

One or more embodiments of the present disclosure are directed to a light-emitting device that can achieve both high color reproducibility and high luminance when used in a liquid crystal display.

A specific means for solving the issue is as described below, and includes the constituent elements described below. One aspect of the present disclosure is a light-emitting device including a light-emitting element and a fluorescent member. The light-emitting element has a peak emission wavelength in a range of from 400 nm to 470 nm. The fluorescent member includes a first fluorescent material, a second fluorescent material, and a third fluorescent material. The first fluorescent material contains an aluminate containing at least one alkali earth metal selected from the group consisting of Ba, Sr, and Ca, as well as Mg, and Mn, and has a peak emission wavelength in a range of from 510 nm to 525 nm. The second fluorescent material has a different composition from the first fluorescent material, and a peak emission wavelength in a range of from 510 nm to 550 nm. The third fluorescent material has a peak emission wavelength in a range of from 620 nm to 670 nm. The light-emitting device has an emission spectrum where the relative emission intensity at 500 nm is 35% or less and the relative emission intensity at 540 nm is 80% or less when the local maximum light-emission intensity in a range of from 510 nm to 535 nm is taken as 100%.

A light-emitting device according to an embodiment of the present invention will now be described. However, the embodiment described below is a mere example for embodying the technical concept of the present invention, and the present invention is not limited to the light-emitting device described below. The relationship between the color names and the chromaticity coordinates, the relationship between the wavelength ranges of light and the color names of monochromatic light, and others are in accordance with Japanese Industrial Standard (JIS) Z8110. For the amount of each component contained in a composition, when a plurality of substances corresponding to the component is present in the composition, the amount of the component means the total amount of the substances present in the composition unless otherwise specified.

Light-emitting Device

A light-emitting device 100 according to the present embodiment includes a light-emitting element 10, and a fluorescent member 50. The light-emitting element 10 has a peak emission wavelength in a range of from 400 nm to 470 nm. The fluorescent member 50 includes a first fluorescent material 71, a second fluorescent material 72, and a third fluorescent material 73. The first fluorescent material 71 includes an aluminate containing at least one alkali earth metal selected from the group consisting of Ba, Sr, and Ca, as well as Mg, and Mn, and has a peak emission wavelength in a range of from 510 nm to 525 nm. The second fluorescent material 72 has a different composition from the first fluorescent material 71 and a peak emission wavelength in a range of from 510 nm to 550 nm. The third fluorescent material 73 has a peak emission wavelength in a range of from 620 nm to 670 nm. The light-emitting device 100 has an emission spectrum having a relative emission intensity at 500 nm of 35% or less and a relative emission intensity at 540 nm of 65% or less when the local maximum light-emission intensity in a range of from 510 nm to 535 nm is taken as 100%.

The light-emitting device 100 includes the first fluorescent material 71, which has a specific composition and an emission wavelength in a range of from 510 nm to 525 nm, in combination with the second fluorescent material 72, which has a peak emission wavelength in a range of from 510 nm to 550 nm, as a green light-emitting component having a local peak emission in a range of from 510 nm to 535 nm. This composition can reduce the amounts of the light-emitting components in the blue-green region and the yellow-green region in the emission spectrum to a certain amount or less, and can further increase the amount of the green component, which has superior color reproducibility. In other words, emissions of blue, green, and red in the respective wavelength regions are emphasized in the emission spectrum of the light-emitting device 100. Thus, a liquid crystal display including the light-emitting device 100 can have a wider color reproduction range. In particular, a high-definition liquid crystal display including the light-emitting device 100 can exhibit superior numerical values according to BT. 2020, which is a standard for a color reproduction range, and can achieve a wider color reproduction range compared to the case of using a light-emitting device known in the art.

The light-emitting device 100 can achieve both high color reproducibility and high luminance of a liquid crystal display. The reason for this may be as follows: The green wavelength region lies between the red and blue wavelength regions, and contains a light-emitting component that contributes to improving luminance in relation to visibility. Thus, to produce a liquid crystal display having high color reproducibility and high luminance, it is particularly important to adjust the half bandwidth and the emission intensity of the emission spectrum in the green color wavelength region of the light-emitting device to be used in a liquid crystal display. A light-emitting device including the first fluorescent material having an emission spectrum with a narrow half bandwidth according to the present embodiment can reduce the influence of green-light emission on red-light emission and blue-light emission. This enables clear separation of colors of light through the color filters, resulting in an improved color reproducibility of the liquid crystal display. Further, the emission spectrum of the second fluorescent material, which has a wide half bandwidth, can increase the light-emitting component at around 555 nm that contributes to improving luminance in relation to visibility in an extent not to affect the expansion of the color reproduction range. This enables a light-emitting device that can contribute to improved color reproducibility and improved luminance of a liquid crystal display.

The light-emitting device 100 will now be described in detail with reference to FIG. 1. The light-emitting device 100 is a surface mount light-emitting device. The light-emitting device 100 includes the light-emitting element 10, and the molded body 40, on which the light-emitting element 10 is disposed. The light-emitting element 10 may be a gallium nitride compound-semiconductor that emits visible light at short-wavelengths (e.g., in a range of from 380 nm to 500 nm) and has a peak emission wavelength in a range of from 400 nm to 470 nm. The molded body 40 includes a first lead 20, a second lead 30, and a resin portion 42 formed in an integral manner. The molded body 40 has a recess defined by a bottom surface and side surfaces, and the light-emitting element 10 is disposed on the bottom surface of the recess. The light-emitting element 10 has a pair of electrodes, positive and negative, and the positive and negative electrodes are electrically connected to the first lead 20 and the second lead 30, respectively, with a wire 60. The light-emitting element 10 is covered with the fluorescent member 50. The fluorescent member 50 includes, for example, a resin and the fluorescent material 70, which converts the wavelength of light from the light-emitting element 10. The fluorescent material 70 includes the first fluorescent material 71, the second fluorescent material 72, and the third fluorescent material 73.

The total fluorescent material 70 content in the fluorescent member 50 relative to 100 parts by weight of the resin is, for example, 50 parts by weight or more, preferably 50.5 parts by weight or more, more preferably 51 parts by weight or more, and still more preferably 60 parts by weight or more, and also, for example, 300 parts by weight or less, preferably 250 parts by weight or less, more preferably 230 parts by weight or less, still more preferably 160 parts by weight or less. With the total fluorescent material content of the fluorescent member 50 within the range above, light emitted by the light-emitting element 10 can be efficiently wavelength-converted by the fluorescent material 70.

The fluorescent member 50 may further contain a filler, a light diffuser or other materials in addition to the resin which is a sealant and the fluorescent material 70. For example, a light diffuser when contained in the fluorescent member 50 can ease directivity of light from the light-emitting element 10 to increase the viewing angle. Examples of the filler include silica, titanium oxide, zinc oxide, zirconium oxide, and alumina. When the fluorescent member 50 contains a filler, the filler content can be, for example, from 1 part by weight to 20 parts by weight relative to 100 parts by weight of the resin.

The fluorescent member 50 serves not only as a wavelength conversion member containing the fluorescent material 70 but also as a member for protecting the light-emitting element 10 and the fluorescent material 70 from outside environment. In FIG. 1, the first fluorescent material 71, the second fluorescent material 72, and the third fluorescent material 73 are mixed and are present near the light-emitting element 10. In other words, the fluorescent material 70 is arranged in the fluorescent member 50 near the light-emitting element 10 rather than near the top surface of the molded body 40. Arranging the fluorescent material 70 near the light-emitting element 10 in this manner allows the wavelength of light from the light-emitting element 10 to be efficiently converted to produce a light-emitting device with high emission efficiency. However, the arrangement of the fluorescent material 70 in the fluorescent member 50 and the light-emitting element 10 is not limited to one in which they are in close proximity to each other. The fluorescent material 70 may be spaced apart from the light-emitting element 10 in the fluorescent member 50 to reduce the influence of heat from the light-emitting element 10 on the fluorescent material 70. The particles of the fluorescent material 70 may also be approximately evenly dispersed throughout the fluorescent member 50 to emit light with further reduced color unevenness.

Figure 2:
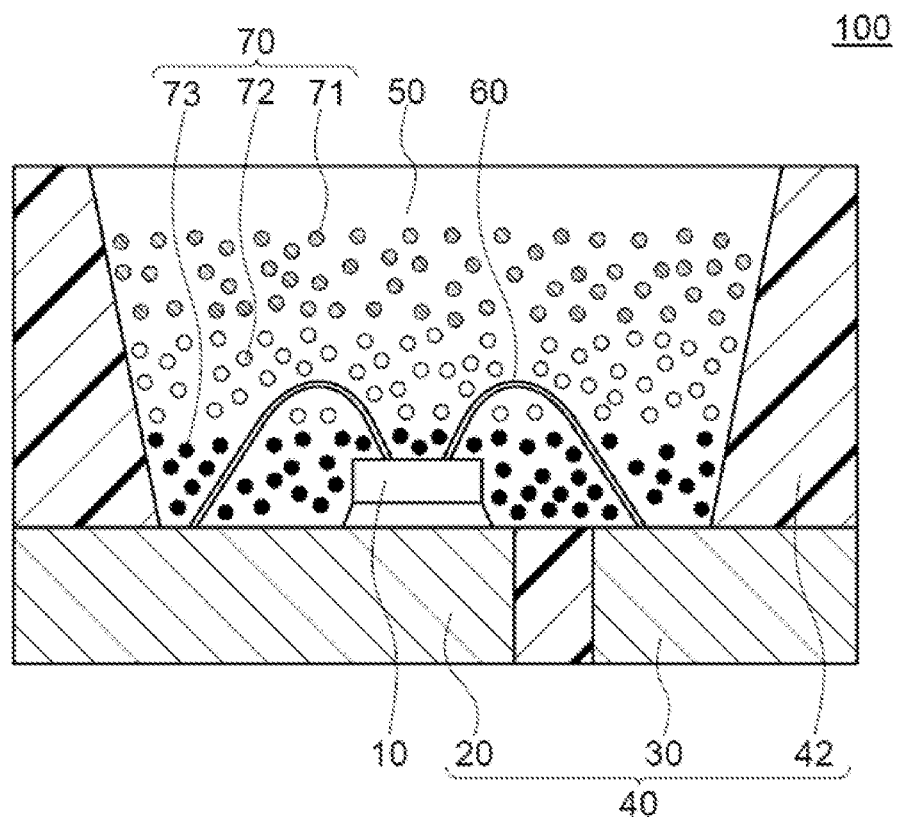
FIG. 2 is a schematic cross-sectional view of another exemplary light-emitting device according to the present disclosure.

FIG. 2 is a schematic cross-sectional view of another example of the light-emitting device 100 according to the present disclosure. In FIG. 2, the third fluorescent material 73 in the fluorescent member 50 is arranged near the light-emitting element 10, the second fluorescent material 72 is arranged above the third fluorescent material 73, and the first fluorescent material 71 is arranged above the second fluorescent material 72. This arrangement allows each fluorescent material to be more efficiently excited by light emitted from the light-emitting element 10.

Light-Emitting Element

The light-emitting element 10 emits visible light having an emission spectrum at short wavelengths, e.g., in a range of from 380 nm to 485 nm, and has a peak emission wavelength in a range of from 400 nm to 470 nm, preferably from 430 nm to 470 nm, and more preferably from 440 nm to 460 nm. The light-emitting element 10 having a peak emission wavelength within the range above can increase the emission efficiency of the first to third fluorescent materials.

As the light-emitting element 10, a semiconductor light-emitting element including a gallium nitride semiconductor ($In_XAl_YGa_{1-X-Y}N$ where $0 \leq X$, $0 \leq Y$, and $X+Y \leq 1$) is preferably used. Using a semiconductor light-emitting element as the excitation light source produces a highly efficient light-emitting device that has high output linearity to the input and is stable and resistant to mechanical impact. The light-emitting element 10 has an emission spectrum with a half bandwidth of, for example, 30 nm or less.

Fluorescent Member

The fluorescent member 50 contains the fluorescent material 70, and may contain, for example, another fluorescent material, a resin, and a light diffuser as appropriate. The fluorescent material 70 contains at least the first fluorescent material 71 and the second fluorescent material 72, which emit green light, and a third fluorescent material 73, which emits red light.

First Fluorescent Material

The first fluorescent material 71 has a peak emission wavelength in a range of from 510 nm to 525 nm, and contains an aluminate containing Mg, Mn, and at least one alkali earth metal selected from the group consisting of Ba, Sr, and Ca. The alkali earth metal preferably contains at least Sr. When the aluminate contains Ba, the Ba content ratio in the alkali earth metal in the aluminate is, for example, 50 mol % or more, and preferably 70 mol % or more, and may be 99 mol % or less. The first fluorescent material 71 may have a peak emission wavelength of from 510 nm to less than 520 nm.

The first fluorescent material 71 preferably has a composition essentially represented by formula (I) below. The fluorescent material having a composition represented by formula (I) will hereinafter be also referred to as "first fluorescent material (I)".

$$X^1_p Eu_t Mg_q Mn_r Al_s O_{p+t+q+r+1.5s} \quad (I)$$

In the formula (I), $X^1$ is at least one selected from the group consisting of Ba, Sr, and Ca; and p, q, r, s and t satisfy $0.5 \leq p \leq 1$, $0 \leq q \leq 0.7$, $0.2 \leq r \leq 0.7$, $8.5 \leq s \leq 13$, $0 \leq t \leq 0.5$, $0.5 \leq p+t \leq 1.2$, and $0.2 \leq q+r \leq 1$.

In the first fluorescent material (I), $X^1$ preferably contains at least Ba. The first fluorescent material (I) containing Ba in its composition can maintain, for example, relatively high reflectance at its peak emission wavelength, and relatively low reflectance for light in the blue region. In other words, absorption of light in the blue region is high. This seemingly results in high emission intensity of the first fluorescent material (I).

In formula (I), p is a total compositional molar ratio of $X^1$, which is at least one element selected from the group consisting of Ba, Sr, and Ca. In the first fluorescent material represented by formula (I), if p is 0.5 or more and not more than 1, the first fluorescent material (I) may have an stable crystal structure, or may have a higher emission intensity. p is preferably 0.6 or more, and more preferably 0.8 or more. p may also be 0.99 or less.

In formula (I), q is a compositional molar ratio of Mg. If q is 0.7 or less, the compositional molar ratio of Mg is low, and the relative amount of Mn as an activating element is high. This may result in a higher relative emission intensity. q is preferably 0.05 or more, and more preferably 0.1 or more, and also preferably 0.65 or less, and more preferably 0.6 or less. When q satisfies $0.0 \leq q \leq 0.7$ in formula (I), the fluorescent material may have a peak emission wavelength in a range of from 510 nm to 525 nm in the emission spectrum when excited by light from the near-ultraviolet to blue region. The fluorescent material may also have a relatively low reflectance, and a greater emission intensity. A liquid crystal display including a light-emitting device containing the first fluorescent material 71 achieves high color reproducibility.

In formula (I), r is a compositional molar ratio of Mn. Mn is an activating element of the first fluorescent material (I). The first fluorescent material 71 may further contain a rare-earth element, such as Eu or Ce, as an activating element in addition to Mn. In particular, containing Mn and Eu as an activating element causes Eu to absorb light to excite its electron. The excitation energy is transmitted from Eu to Mn, and is expected to further contribute to the emission of Mn. This can improve the emission intensity of the first fluorescent material when excited by an excitation light source having a peak emission wavelength in a range of from 400 nm to 470 nm. Thus, containing Mn and Eu is preferable. In formula (I), if r is 0.2 or more and not more than 0.7, for example, the reflectance may be low, and the emission intensity may be high when excited by light in the near-ultraviolet to blue region. In formula (I), if r is 0.2 or more, the activation amount of Mn is sufficient, the absorption of light is large, and the reflectance is low when excited by light in the near-ultraviolet to blue region. Thus, the first fluorescent material (I) may be able to have a high emission intensity. In formula (I), if r is not more than 0.7, the activating amount of Mn may be small, and concentration quenching may not occur in the first fluorescent material (I), resulting in a higher emission intensity. In formula (I), r is preferably 0.3 or more, and more preferably 0.4 or more, and also preferably 0.6 or less, and more preferably 0.55 or less.

In formula (I), q+r is from 0.2 to 1. If q+r is 0.2 or more and not more than 1, the relative emission intensity may be sufficient. q+r is preferably 0.3 or more, and more preferably 0.4 or more, and also preferably 0.99 or less, and more preferably 0.98 or less.

In formula (I), t is a compositional molar ratio of Eu. If t is not more than 0.5, the emission intensity may be high. t is preferably 0.3 or less, and more preferably 0.2 or less.

In formula (I), p+t is from 0.5 to 1.2. If p+t is 0.5 or more and not more than 1.2, the crystal structure of the first fluorescent material (I) may be stable, and the emission intensity may be high. p+t is preferably 0.55 or more, and more preferably 0.60 or more, and also preferably 1.1 or less, and more preferably 1.05 or less.

In formula (I), s is a compositional molar ratio of Al. If s is 8.5 or more and not more than 13, the crystal structure may be stable, and the emission intensity of the first fluorescent material (I) may be high when excited by light in the near-ultraviolet to blue region. In formula (I), s is preferably 9 or more, and also preferably 13 or less, more preferably 12 or less, and still more preferably 11 or less.

The first fluorescent material 71 may be produced by using a flux, such as a halide, to enhance its reactivity as a material. In this case, when a flux containing alkali metal is used, a small amount of alkali metal may be detected from the fluorescent material 71. Even in such a case, when, for example, the main components of the fluorescent material 71 satisfy formula (I), the fluorescent material 71 is a first fluorescent material (I). When the first fluorescent material 71 contains alkali metal, the alkali metal content ratio is preferably 1000 ppm or less, and more preferably 990 ppm or less, and also preferably 100 ppm or more, more preferably 200 ppm or more, and still more preferably 300 ppm or more. In the first fluorescent material 71 containing alkali metal, the compositional molar ratio of the alkali metal in the first fluorescent material 71 is preferably 0.05 mole or less, and more preferably 0.04 mole or less. When the first fluorescent material 71 contains a halogen element, the compositional molar ratio of the halogen element in the first fluorescent material 71 is preferably 0.12 mole or less, and more preferably 0.1 mole or less.

Examples of the flux include alkali metal fluorides and alkali metal chlorides. Specifically, sodium fluoride (NaF) or potassium fluoride (KF) is preferable, and NaF is more preferable.

The first fluorescent material 71 absorbs light emitted from the light-emitting element 10, which has a peak emission wavelength in a range of from 400 nm to 470 nm, and emits light having a peak emission wavelength in a range of from 515 nm to 525 nm. The first fluorescent material 71 emits light having a half bandwidth of the emission spectrum of preferably 45 nm or less, more preferably 40 nm or less, still more preferably 35 nm or less, and furthermore preferably 30 nm or less when excited by light emitted from a light-emitting element having a peak emission wavelength of, for example, 450 nm. The half bandwidth is, for example, 20 nm or more.

The first fluorescent material 71 is excited by light from a light-emitting element having a peak emission wavelength in a range of from 400 nm to 470 nm, and emits light having a narrow half bandwidth of the emission spectrum in the green region. A liquid crystal display including the light-emitting device including the first fluorescent material can have a wide color reproduction range.

The first fluorescent material 71 has an average particle diameter of, for example, from 5 µm to 50 µm. The first fluorescent material having an average particle diameter of 5 µm or more may, for example, absorb more light and have a higher emission intensity. Also, the first fluorescent material having an average particle diameter of 50 µm or less may have less variation in color among the light-emitting devices to be produced. The first fluorescent material has an average particle diameter of preferably 5.5 µm or more, more preferably 6 µm or more, and still more preferably 7 µm or more, and also preferably 48 µm or less, more preferably 45 µm or less, and still more preferably 30 µm or less.

An average particle diameter of a fluorescent material as used herein is a volume average particle diameter (median diameter) at which the volume cumulative frequency from the small diameter side reaches 50%, which is determined by using a laser diffraction particle size analyzer (e.g., MASTER SIZER 3000 by Marvern Instrument Instrument).

Second Fluorescent Material

The fluorescent member 50 included in the light-emitting device 100 contains at least one second fluorescent material 72 in addition to the first fluorescent material 71 as a green light-emitting fluorescent material. The second fluorescent material is selected from fluorescent materials having a different composition from the first fluorescent material and a peak emission wavelength in a range of from 510 nm to 550 nm. The second fluorescent material 72 may include a single fluorescent material alone, or two or more in combination.

The second fluorescent material 72 preferably contains at least one material selected from the group consisting of β sialon fluorescent materials, silicate fluorescent materials, and sulfide fluorescent materials. A light-emitting device including at least one fluorescent material selected from these fluorescent materials as the second fluorescent material 72 in combination with the first fluorescent material 71 can have a further wider color reproduction range. The second fluorescent material 72 preferably has a peak emission wavelength of from 520 nm to 545 nm. Further, the second fluorescent material 72 preferably has a longer peak emission wavelength than the first fluorescent material. The difference in peak emission wavelength between the first fluorescent material 71 and the second fluorescent material 72 is, for example, 30 nm or less, preferably 25 nm or less, and more preferably substantially 0 nm. The light-emitting device 100 including the second fluorescent material 72 having such a peak emission wavelength can have more light-emitting components at around 555 nm that contribute to improving luminance in an extent not to affect the expansion of the color reproduction range.

The second fluorescent material 72 preferably contains at least one material selected from the group consisting of fluorescent materials having a composition represented by any of the formulas (IIa) to (IId) below. The light-emitting device 100 including the second fluorescent material 72 having a specific composition can have a wider color reproduction range. The formula (IIa) represents a composition of β sialon fluorescent materials, the formulas (IIb) and (IId) represent compositions of silicate fluorescent materials, and the formula (IIc) represents a composition of sulfide fluorescent materials.

$$Si_{6-z}Al_zO_zN_{8-z}:Eu \text{ (provided, however, } 0 \leq z \leq 4.2, \text{ and preferably } 0.02 \leq z \leq 0.5) \quad (IIa)$$

$$(Ca,Sr)_8MgSi_4O_{16}(Cr,F,Br)_2:Eu \quad (IIb)$$

$$(Sr,Ca,Ba)Ga_2S_4:Eu \quad (IIc)$$

$$(Ba,Sr,Ca)_2SiO_4:Eu \quad (IId)$$

The second fluorescent material 72 absorbs light emitted from the light-emitting element 10 having a peak emission wavelength in a range of from 400 nm to 470 nm, and emits light having a peak emission wavelength in a range of from 510 nm to 550 nm. The second fluorescent material 72 has a half bandwidth of the emission spectrum of preferably 100 nm or less, more preferably 80 nm or less, still more preferably 70 nm or less, and furthermore preferably 65 nm or less when excited by light emitted from the light-emitting element 10 having a peak emission wavelength of, for example, 450 nm. The half bandwidth is, for example, 30 nm or more. The light-emitting device 100 including the second fluorescent material 72 having such a half bandwidth can have more light-emitting components at around 555 nm that contribute to improving luminance in an extent not to affect the expansion of the color reproduction range.

The ratio of the half bandwidth of the second fluorescent material 72 to the half bandwidth of the first fluorescent material 71 is, for example, 1 or more, preferably 1.1 or more, and, for example, 2.5 or less, and preferably 1.8 or less. With the ratio of the half bandwidth in the range above, a wider color reproduction range can be obtained. When the difference in peak emission wavelength between the first fluorescent material 71 and the second fluorescent material 72 is substantially 0 nm, and the ratio of the half bandwidth of the second fluorescent material 72 to the half bandwidth of the first fluorescent material 71 is 1.1 or more, an even wider color reproduction range may be obtained.

To achieve high emission efficiency, the second fluorescent material 72 has an average particle diameter of, for example, 2 μm or more, preferably 5 μm or more, and more preferably 7 μm or more, and also, for example, 50 μm or less, preferably 45 μm or less, and more preferably 42 μm or less.

To achieve a desired color reproducibility, the first fluorescent material 71 and the second fluorescent material 72 content in the fluorescent member 50 is, for example, 50 parts by weight or more, preferably 60 parts by weight or more, and more preferably 70 parts by weight or more, and, for example, 250 parts by weight or less, preferably 220 parts by weight or less, and more preferably 200 parts by weight or less relative to 100 parts by weight of the resin in the fluorescent member 50.

When the second fluorescent material 72 is a β sialon fluorescent material, the content ratio of the second fluorescent material 72 relative to the total amount of the first fluorescent material 71 and the second fluorescent material 72 in the fluorescent member 50 is, for example, 20% by weight or less, 15% by weight or less, 10% by weight or less, less than 10% by weight, preferably 5% by weight or less, more preferably 3% by weight or less, and also, for example, 0.05% by weight or more. When the second fluorescent material 72 is a silicate fluorescent material, the content ratio of the second fluorescent material 72 is, for example, less than 1% by weight, preferably 0.5% by weight or less, and more preferably 0.3% by weight or less, and for example 0.01% by weight or more. When the second fluorescent material 72 is a sulfide fluorescent material, the content ratio of the second fluorescent material 72 is, for example, less than 0.5% by weight, preferably 0.1% by weight or less, and more preferably 0.05% by weight or less, and for example 0.01% by weight or more.

Third Fluorescent Material

The fluorescent member 50 included in the light-emitting device of the present embodiment includes the third fluorescent material 73, which has a peak emission wavelength in a range of from 620 nm to 670 nm. The third fluorescent material is selected from fluorescent materials having a peak emission wavelength in a range of from 620 nm to 670 nm. The third fluorescent material 73 may contain a single fluorescent material alone or two or more in combination.

The third fluorescent material 73 preferably contains at least one material selected from the group consisting of fluoride fluorescent materials, magnesium fluoro-germanate fluorescent materials, nitride fluorescent materials, and sulfide fluorescent materials. A light-emitting device including the third fluorescent material 73 that is at least one selected from these fluorescent materials can have a wider color reproduction range.

The third fluorescent material 73 preferably contains at least one material selected from the group consisting of fluorescent materials having a composition represented by any of the formulas (IIIa) to (IIIe) below. A light-emitting device including a fluorescent material having such a specific composition can have a wider color reproduction range. The formula (IIIa) represents a composition of fluoride fluorescent materials, the formula (IIIb) represents a composition of magnesium fluoro-germanate fluorescent materials, the formulas (IIIc) and (IIId) represent compositions of nitride fluorescent materials, and the formula (IIIe) represents a composition of sulfide fluorescent materials.

$$K_2(Si,Ge,Ti)F_6:Mn \quad (IIIa)$$

$$3.5MgO \cdot 0.5MgF_2 \cdot GeO_2:Mn \quad (IIIb)$$

$$(Sr,Ca)AlSiN_3:Eu \quad (IIIc)$$

$$(Sr,Ca)LiAl_3N_4:Eu \quad (IIId)$$

$$(Ca,Sr)S:Eu \quad (IIIe)$$

The third fluorescent material 73 absorbs light emitted from the light-emitting element 10, which has a peak emission wavelength in a range of from 400 nm to 470 nm, and emits light having a peak emission wavelength in a range of from 620 nm to 670 nm. The third fluorescent material has a half bandwidth of the emission spectrum of preferably 100 nm or less, more preferably 80 nm or less, still more preferably 70 nm or less, and furthermore preferably 65 nm or less, when excited by light from the light-emitting element 10 having a peak emission wavelength of, for example, 450 nm. The half bandwidth can be, for example, 3 nm or more.

To achieve high emission efficiency, the third fluorescent material 73 has an average particle diameter of, for example, 2 μm or more, preferably 5 μm or more, and more preferably 7 μm or more, and also, for example, 50 μm or less, preferably 45 μm or less, and more preferably 42 μm or less.

To achieve a desired color reproduction range, the third fluorescent material 73 content in the fluorescent member 50 is, for example, 0.5 part by weight or more, preferably 1 part by weight or more, more preferably 3 parts by weight or more, and also, for example, 100 parts by weight or less, preferably 90 parts by weight or less, and more preferably 80 parts by weight or less relative to 100 parts by weight of the resin in the fluorescent member 50.

The ratio of the green fluorescent material, which includes the first fluorescent material 71 and the second fluorescent material 72, to the red fluorescent material, which includes the third fluorescent material 73, in the fluorescent member 50 (the green fluorescent material:the red fluorescent material) is, for example, from 5:95 to 99:1, preferably from 20:80 to 98:2, more preferably from 30:70 to 97:3, still more preferably from 40:60 to 96:4, and particularly preferably from 50:50 to 95:5. A light-emitting device including the fluorescent member 50 containing the green fluorescent material and the red fluorescent material in the range above can have a wider color reproduction range.

Other Fluorescent Materials

The fluorescent member 50 may contain other fluorescent materials in addition to the first fluorescent material 71, the second fluorescent material 72, and the third fluorescent material 73 as appropriate. Examples of the other fluorescent materials include $(Y,Gd,Tb,Lu)_3(Al,Ga)_5O_{12}$:Ce, $Ca_3Sc_2Si_3O_{12}$:Ce, $CaSc_2O_4$:Ce, $(La,Y)_3Si_6N_{11}$:Ce, $(Ca,Sr,Ba)_3Si_6O_9N_4$:Eu, $(Ca,Sr,Ba)_3Si_6O_{12}N_2$:Eu, and $(Ba,Sr,Ca)Si_2O_2N_2$:Eu. When the light-emitting device contains other fluorescent materials, the other fluorescent material content is selected as appropriate in accordance with, for example, the purpose. The other fluorescent material content relative to a total amount of the first fluorescent material 71, the second fluorescent material 72, and the third fluorescent material 73 is, for example, 5% by mass or less, and preferably 2% by mass or less.

The light-emitting device 100 has a relative emission intensity at 500 nm of 35% or less, preferably 30% or less, and more preferably 25% or less when the local maximum emission intensity in a range of from 510 nm to 535 nm in the emission spectrum is taken as 100%. The relative emission intensity at 540 nm is 80% or less, 75% or less, 70% or less, 65% or less, preferably 60% or less, and more preferably 55% or less. With the relative emission intensity in the range above, each emission of blue, green, and red in the emission spectrum of the light-emitting device is emphasized in the respective blue and red-light wavelength regions and the green light wavelength region between them, which has strong influence on the color reproduction range. This increases color purity of each color, and can expand the color reproduction range of a liquid crystal display including the light emitting device. When there are two or more local maximum values of emission in a range of from 510 nm to 535 nm, the maximum emission intensity among them is used as a reference.

To achieve high color reproduction range and high luminance, the peak emission wavelength in the range of from 510 nm to 535 nm in the emission spectrum, or in the green region, is, for example, from 512 nm to 530 nm, and preferably from 514 nm to 528 nm. The half bandwidth is, for example, from 20 nm to 40 nm, and preferably from 23 nm to 35 nm.

The light-emitting device 100 emits mixed light of light from the light-emitting element and light emitted from the first fluorescent material 71, the second fluorescent material 72, and the third fluorescent material 73. The chromaticity values of the mixed light in the CIE 1931 xy chromaticity coordinates are: for example, x in a range of from 0.22 to 0.34 and y in a range of from 0.16 to 0.34, preferably x in a range of from 0.22 to 0.33 and y in a range of from 0.17 to 0.33.

EXAMPLES

Examples of the present disclosure will now be described in detail, but the present invention is not limited to these Examples.

Fluorescent Material

Before producing the light-emitting devices of examples and comparative examples, the first and second fluorescent materials, which emit green, and a third fluorescent material, which emits red, were each prepared. As the first fluorescent material, Fluorescent Materials A and A2, and as the second fluorescent material, Fluorescent Materials B to D shown in Table 1 were prepared.

Fluorescent Material A

As Fluorescent Material A, a fluorescent material having a composition represented by formula (I): $X^1_pEu_tMg_qMn_rAl_sO_{p+t+q+r+1.5s}$ (wherein $X^1$ is Ba, and the compositional molar ratio satisfies t=0, p=1.0, q=0.5, r=0.5, and s=10.0) was prepared. Specifically, $BaCO_3$, MgO, $MnCO_3$, $Al_2O_3$, and $MgF_2$ were prepared as raw materials, and NaF was prepared as a flux. These were weighed so that the molar ratio $BaCO_3$:MgO:$MgF_2$:$MnCO_3$:$Al_2O_3$:NaF satisfies 1.0:0.4:0.1:0.5:10.0:0.1, and mixed to obtain a mixture. The mixture was charged into an alumina crucible, and heat-treated at 1500° C. for 5 hours in a mixed gas atmosphere of $H_2/N_2$=3/97 (volume ratio) under ordinary pressure to obtain powder.

To the resultant powder, light having an excitation wavelength of 450 nm was applied, and its emission spectrum at room temperature (25° C.±5° C.) was measured using a quantum efficiency measurement system (QE-2000 by Otsuka Electronics), and the wavelength at which the emission intensity was maximum was determined as a peak emission wavelength (nm). The peak emission wavelength of the powder was 517 nm. The powder was used as Fluorescent Material A having a composition represented by $Ba_{1.0}Mg_{0.5}Mn_{0.5}Al_{10}O_{17}$.

Fluorescent Material A2

As Fluorescent Material A2, a fluorescent material having a composition represented by formula (I): $X^1_pEu_tMg_qMn_rAl_sO_{p+t+q+r+1.5s}$ (wherein $X^1$ is Ba, and the compositional molar ratio satisfies t=0.1, p=0.9, q=0.5, r=0.5, and s=10.0) was prepared. Specifically, $BaCO_3$, $Eu_2O_3$, MgO, $MnCO_3$, $Al_2O_3$, and $MgF_2$ were prepared as raw materials, and NaF was prepared as a flux. These were weighed so that the molar ratio $BaCO_3$:$Eu_2O_3$:MgO:$MgF_2$:$MnCO_3$:$Al_2O_3$:NaF satisfies 0.9:0.1:0.4:0.1:0.5:10.0:0.1, and mixed to obtain a mixture. The mixture was heat-treated in the same manner as Fluorescent Material A to obtain powder.

The peak emission wavelength of the powder measured in the same manner as Fluorescent Material A was 517 nm. The powder was used as Fluorescent Material A2 having a composition represented by $Ba_{0.9}Eu_{0.1}Mg_{0.5}Mn_{0.5}Al_{10}O_{17}$.

Fluorescent Material B

As Fluorescent material B, a fluorescent material having a composition represented by $Si_{6-z}Al_zO_zN_{8-z}$:Eu (z=0.06) (hereinafter "β sialon fluorescent material") was prepared. The peak emission wavelength of Fluorescent Material B, or the β sialon fluorescent material, measured in the same manner as Fluorescent Material A was 529 nm.

Fluorescent Material C

As Fluorescent Material C, a fluorescent material having a composition represented by $Ca_8MgSi_4O_{16}Cl_2$:Eu (hereinafter also referred to as "chlorosilicate fluorescent material") was prepared. The peak emission wavelength of Fluorescent Material C, or the chlorosilicate fluorescent material, measured in the same manner as Fluorescent Material A was 522 nm.

Fluorescent material D

As Fluorescent material D, a fluorescent material having a composition represented by $SrGa_2S_4$:Eu (hereinafter also referred to as "thiogallate (SGS) fluorescent material") was prepared. The peak emission wavelength of Fluorescent Material D, or the SGS fluorescent material, measured in the same manner as Fluorescent Material A was 535 nm.

Third Fluorescent Material

As the third fluorescent material, which emits red light, a fluorescent material having a composition represented by $K_2SiF_6$:Mn (hereinafter also referred to as "KSF fluorescent material") was prepared. The peak emission wavelength of the third fluorescent material, or the KSF fluorescent material, measured in the same manner as Fluorescent Material A was 631 nm.

For each fluorescent material, the measurements described below were carried out.

Evaluation of Light Emission Properties

Figure 3:
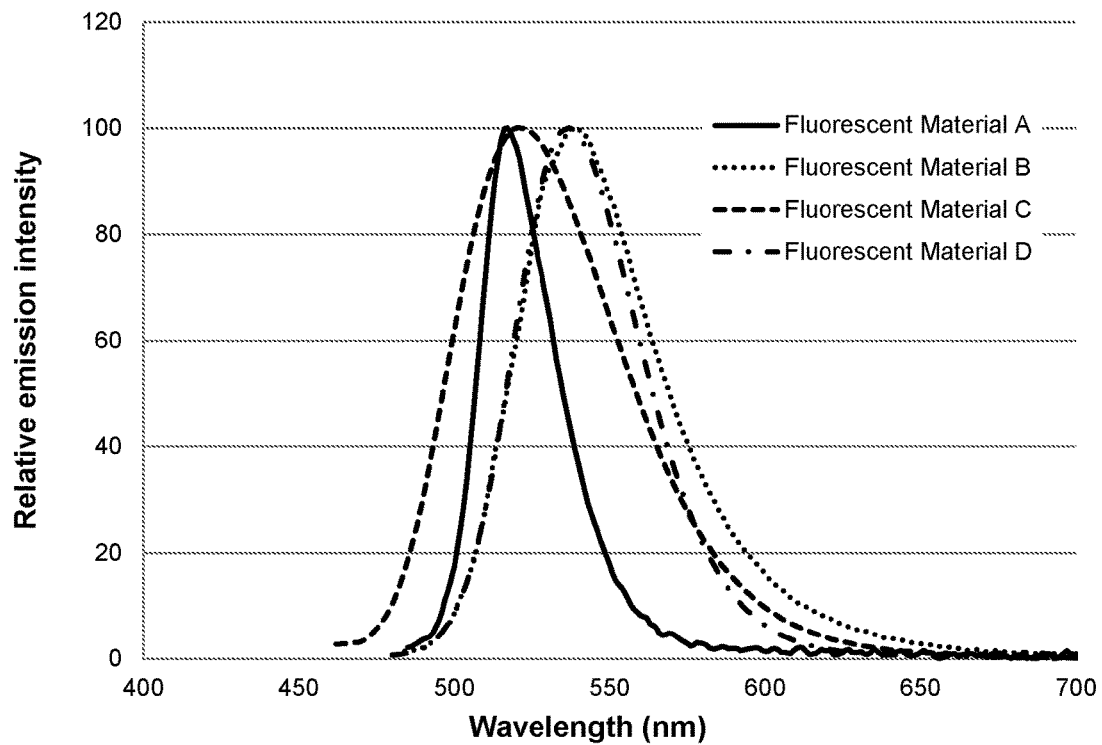
FIG. 3 shows emission spectra of fluorescent materials included in the light-emitting devices according to examples of the present disclosure and comparative examples.
Figure 4:
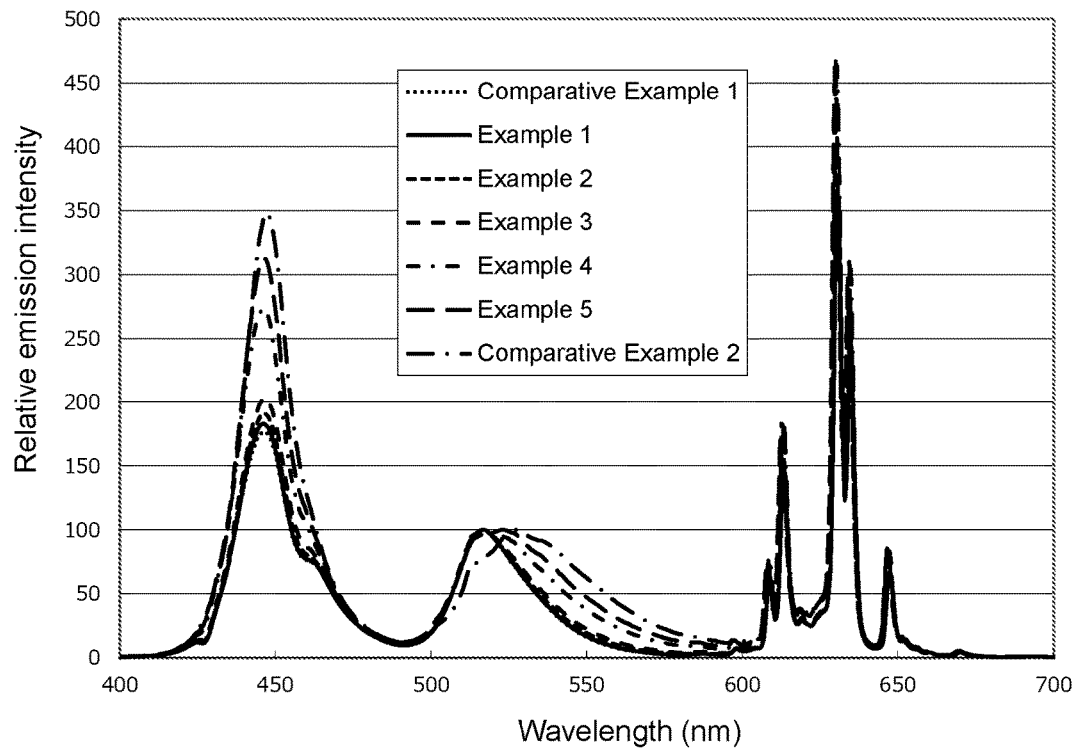
FIG. 4 shows emission spectra of light-emitting devices according to Examples 1 to 4 of the present disclosure and Comparative Examples 1 to 3.
Figure 5:
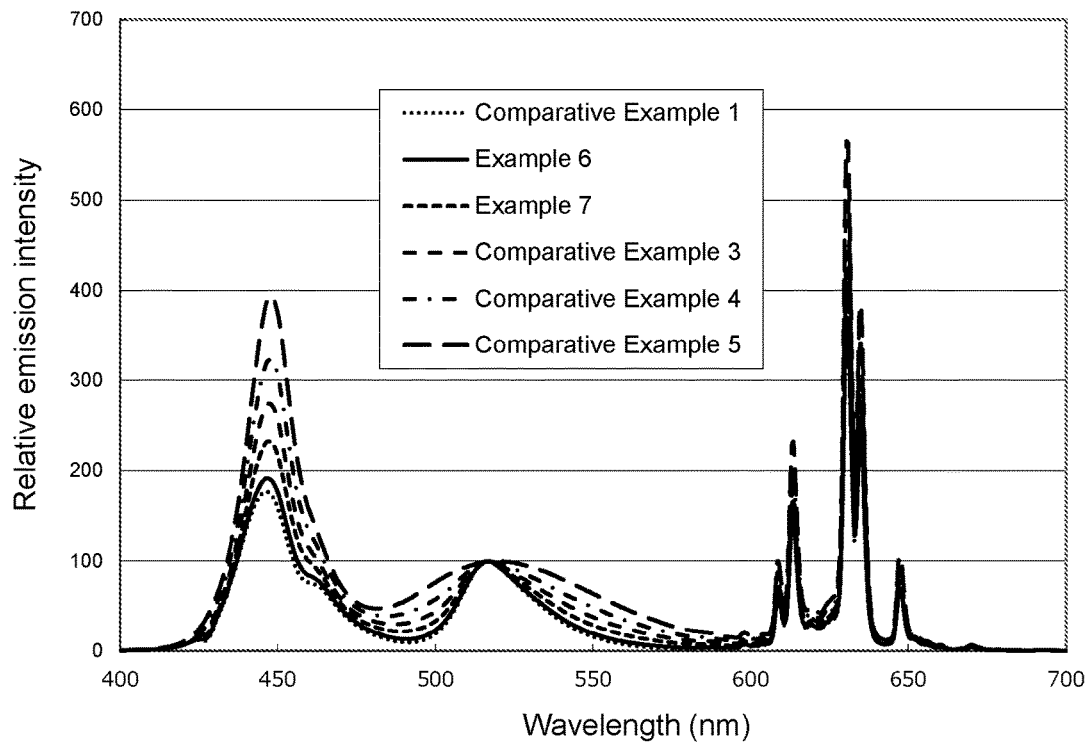
FIG. 5 shows emission spectra of light-emitting devices according to Examples 5 and 6 of the present disclosure and Comparative Examples 1 and 4 to 6.
Figure 6:
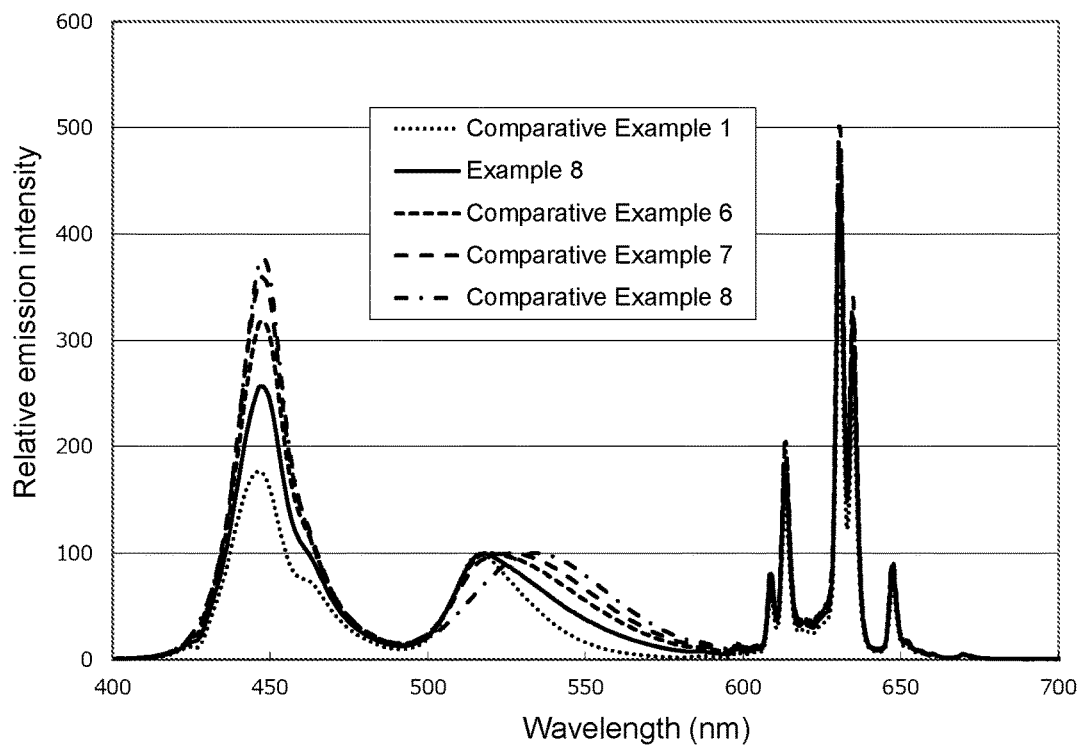
FIG. 6 shows emission spectra of light-emitting devices according to Example 7 of the present disclosure and Comparative Examples 1 and 7 to 9.
Figure 7:
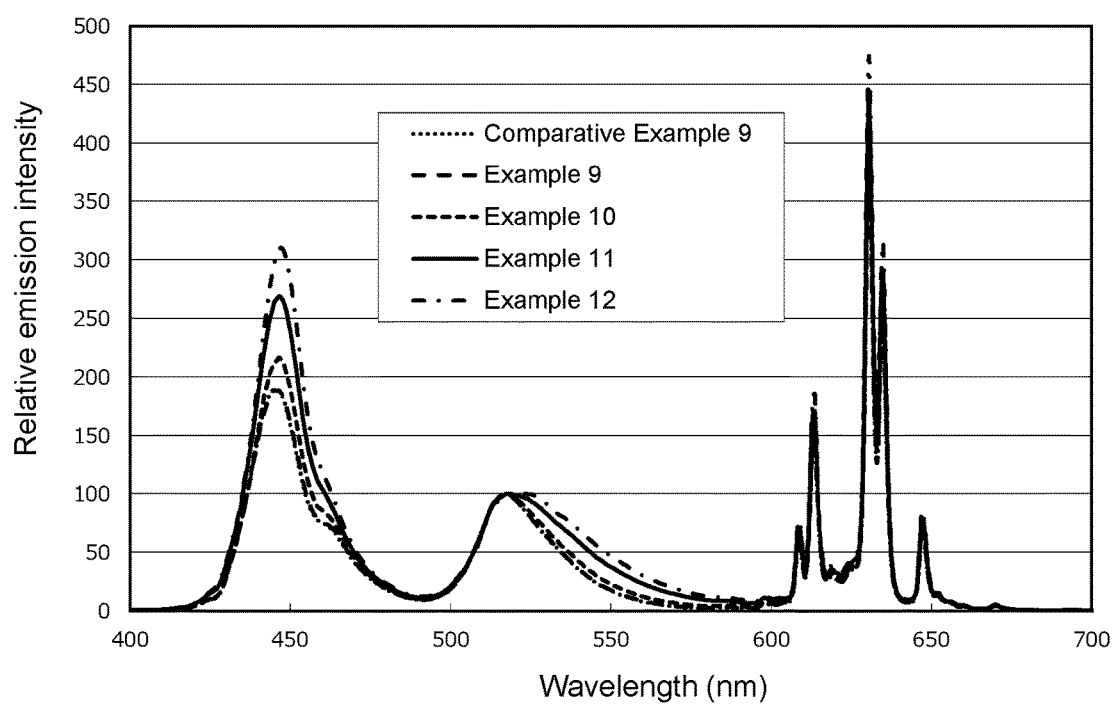
FIG. 7 shows emission spectra of light-emitting devices according to Examples 8 to 10 of the present disclosure and Comparative Examples 10 and 11.

For each of Fluorescent Materials A, A2, B, C, and D, light emission properties were measured. The half bandwidth of each emission spectrum was measured. The results are shown in Table 1. The emission spectra of the fluorescent Materials A, B, C, and D normalized with the respective maximum emission intensities are shown in FIG. 3. The emission spectrum of Fluorescent Material A2 was approximately the same as Fluorescent Material A.

TABLE 1

| Fluorescent material | Composition | Peak emission wavelength (nm) | Half bandwidth (nm) |
|---|---|---|---|
| A | $Ba_{1.0}Mg_{0.5}Mn_{0.5}Al_{10}O_{17}$ | 517 | 28 |
| A2 | $Ba_{0.9}Eu_{0.1}Mg_{0.5}Mn_{0.5}Al_{10}O_{17}$ | 517 | 28 |
| B | $Si_{6-z}Al_zO_zN_{8-z}$:Eu (z = 0.06) | 529 | 50 |
| C | $Ca_8MgSi_4O_{16}Cl_2$:Eu | 522 | 63 |
| D | $SrGa_2S_4$:Eu | 535 | 48 |

Examples 1 to 10, Comparative Examples 1 to 11

The corresponding first fluorescent material, second fluorescent material, the third fluorescent material, and silicone resin were mixed to satisfy each compositional ratio shown in Table 2, and then dispersed and defoamed to have a composition for each fluorescent member. The composition for each fluorescent member was adjusted to have a compositional ratio so that the light-emitting device to be produced emits mixed light having CIE 1931 xy chromaticity coordinates of around x=0.26, y=0.22. The composition for each fluorescent member was charged on a blue light-emitting LED (light-emitting element) having a peak emission wavelength of 455 nm, and then cured to produce each light-emitting device 100 as shown in FIG. 1. Fluorescent Material A or A2 as the first fluorescent material, any of Fluorescent materials B to D as the second fluorescent material, and the KSF fluorescent material as the third fluorescent material were used. In Table 2, the total amount of the fluorescent materials (% by weight) is a total content ratio (% by weight) of the fluorescent materials in the composition relative to the amount of the resin. The details of the fluorescent materials show the content ratio of each fluorescent material in the total amount of the fluorescent materials (% by weight).

TABLE 2

| | First fluorescent material | Second fluorescent material | Total amount of fluorescent material(s) (wt %) | Details of fluorescent materials (wt %) | | |
|---|---|---|---|---|---|---|
| | | | | First fluorescent material | Second fluorescent material | Third fluorescent material |
| Comparative Example 1 | Fluorescent material A | — | 146.7 | 93.4 | 0.0 | 6.6 |
| Example 1 | | Fluorescent material B | 139.3 | 93.1 | 0.1 | 6.8 |
| Example 2 | | | 133.7 | 92.3 | 0.5 | 7.2 |
| Example 3 | | | 118.0 | 91.4 | 0.9 | 7.7 |
| Example 4 | | | 125.3 | 88.7 | 4.7 | 6.6 |
| Example 5 | | | 76.4 | 79.6 | 8.8 | 11.5 |
| Comparative Example 2 | | | 18.3 | 0.0 | 46.8 | 53.2 |
| Example 6 | | Fluorescent material C | 123.3 | 92.4 | 0.1 | 7.5 |
| Example 7 | | | 87.1 | 89.3 | 0.4 | 10.3 |
| Comparative Example 3 | | | 62.0 | 84.8 | 0.9 | 14.3 |
| Comparative Example 4 | | | 42.8 | 73.2 | 2.3 | 24.5 |
| Comparative Example 5 | | | 17.7 | 0.0 | 12.4 | 87.6 |
| Example 8 | | Fluorescent material D | 85.5 | 89.7 | 0.1 | 10.3 |
| Comparative Example 6 | | | 59.6 | 85.0 | 0.4 | 14.5 |
| Comparative Example 7 | | | 44.8 | 79.2 | 0.8 | 20.0 |
| Comparative Example 8 | | | 13.7 | 0.0 | 5.3 | 94.7 |
| Comparative Example 9 | Fluorescent material A2 | — | 138.0 | 92.8 | 0.0 | 7.2 |
| Example 9 | | Fluorescent material B | 138.5 | 92.7 | 0.1 | 7.3 |
| Example 10 | | | 120.0 | 90.6 | 0.9 | 8.5 |
| Example 11 | | | 76.6 | 83.8 | 4.4 | 11.8 |
| Example 12 | | | 56.5 | 75.5 | 8.4 | 16.2 |

For each light-emitting device, the following measurements were carried out. The results are shown in Table 3. Table 3 shows the types of the first and second fluorescent materials, and the ratio of the second fluorescent material (% by weight) to the total amount of the first fluorescent material and the second fluorescent material.

Color Reproduction Range

Simulations were performed using the emission spectrum data of each light-emitting device determined by a total luminous flux measurement system including an integrating sphere and the transmittance curve data of color filters. Assuming the color reproduction range according to BT. 2020 of the liquid crystal display including the light-emitting device of Comparative Example 1 as 100%, the relative BT. 2020 (%) values of liquid crystal displays each including any of the other light emitting devices were calculated. Also, the luminous intensity (cd/m$^2$) of each liquid crystal display was calculated, and assuming the luminous intensity (cd/m$^2$) of the liquid crystal display including the light-emitting device of Comparative Example 1 as 100%, the relative value of the luminance (%) of each liquid crystal display was calculated. For color filters, color filters having a color reproduction range according to BT. 2020 of about 80% when used in a liquid crystal display including the light-emitting device of Comparative Example 1 were used.

Relative Luminous Flux

The luminous flux of each light-emitting device was measured using a total luminous flux measurement system with an integrating sphere. Assuming the luminous flux of the light-emitting device of Comparative Example 1 as 100%, the relative luminous flux of each of the other light-emitting devices was calculated.

Chromaticity Coordinates (x, y)

Simulations were performed using the emission spectrum data of each light-emitting device and the transmittance curve data of the color filters. Chromaticity values (x, y) of light having passed through the filters were obtained as numerical values (x, y) in the CIE 1931 xy chromaticity coordinates.

Emission Spectrum

The emission spectrum of relative intensity versus wavelength for each light-emitting device was measured using the same system (the total luminous flux measurement system) used for measuring a relative luminous flux. Assuming the local maximum emission intensity in a range of from 510 nm to 535 nm of the emission spectrum of each light-emitting device as 100%, the relative emission intensities at 500 nm and 540 nm to the local maximum emission intensity were calculated. For each light-emitting device, Table 3 shows the wavelength giving the local maximum emission intensity as λp Green (nm), the relative emission intensity at 500 nm as $I_{500}$ (%), and the relative emission intensity at 540 nm as $I_{540}$ (%). Also, FIGS. 4 to 7 show the emission spectrum of each light-emitting device. The emission spectrum of each light-emitting device was normalized with the local maximum emission intensity in a range of from 510 nm to 535 nm.

TABLE 3

| | First fluorescent material | Second fluorescent material | Second fluorescent material ratio (wt %) | Relative BT.2020 (%) | Luminance (%) | Relative luminous flux (%) | Chromaticity coordinates x | Chromaticity coordinates y | λp Green (nm) | $I_{500}$ (%) | $I_{540}$ (%) |
|---|---|---|---|---|---|---|---|---|---|---|---|
| Comparative Example 1 | Fluorescent material A | — | — | 100.0 | 100.0 | 100.0 | 0.261 | 0.223 | 516.5 | 19.3 | 33.5 |
| Example 1 | | Fluorescent material B | 0.1 | 100.2 | 102.4 | 102.2 | 0.262 | 0.223 | 516.5 | 19.7 | 34.7 |
| Example 2 | | | 0.5 | 100.5 | 102.3 | 103.1 | 0.262 | 0.223 | 516.5 | 19.6 | 37.2 |
| Example 3 | | | 1 | 100.8 | 109.1 | 110.9 | 0.262 | 0.223 | 516.5 | 20.2 | 41.1 |
| Example 4 | | | 5 | 98.8 | 120.9 | 128.7 | 0.262 | 0.223 | 517.0 | 23.9 | 58.4 |
| Example 5 | | | 10 | 97.4 | 131.2 | 142.5 | 0.262 | 0.223 | 523.0 | 24.2 | 69.6 |
| Comparative Example 2 | | | 100 | 94.8 | 162.1 | 182.6 | 0.262 | 0.223 | 526.5 | 21.5 | 84.0 |
| Example 6 | | Fluorescent material C | 0.1 | 99.6 | 107.6 | 109.1 | 0.262 | 0.223 | 516.5 | 23.4 | 37.0 |
| Example 7 | | | 0.5 | 98.1 | 124.2 | 129.1 | 0.262 | 0.223 | 516.5 | 33.5 | 46.0 |
| Comparative Example 3 | | | 1 | 95.6 | 137.7 | 145.9 | 0.261 | 0.223 | 516.5 | 44.5 | 54.9 |
| Comparative Example 4 | | | 3 | 93.4 | 157.7 | 170.2 | 0.263 | 0.223 | 516.5 | 57.6 | 65.5 |
| Comparative Example 5 | | | 100 | 91.2 | 193.8 | 212.6 | 0.262 | 0.223 | 519.5 | 76.2 | 80.4 |
| Example 8 | | Fluorescent material D | 0.1 | 99.0 | 126.4 | 134.0 | 0.262 | 0.223 | 518.0 | 22.3 | 56.7 |
| Comparative Example 6 | | | 0.5 | 96.8 | 143.9 | 157.2 | 0.262 | 0.223 | 520.0 | 24.0 | 75.4 |
| Comparative Example 7 | | | 1 | 95.6 | 156.9 | 174.4 | 0.261 | 0.223 | 526.0 | 24.5 | 86.4 |
| Comparative Example 8 | | | 100 | 93.0 | 199.7 | 231.1 | 0.262 | 0.223 | 534.0 | 20.5 | 96.4 |
| Comparative Example 9 | Fluorescent material A2 | — | — | 100.0 | 100.0 | 100.0 | 0.263 | 0.223 | 517.0 | 19.1 | 35.2 |
| Example 9 | | Fluorescent material B | 0.1 | 100.1 | 100.8 | 101.2 | 0.262 | 0.223 | 517.0 | 18.9 | 36.1 |
| Example 10 | | | 1 | 100.6 | 107.5 | 109.8 | 0.264 | 0.223 | 517.5 | 19.4 | 42.2 |
| Example 11 | | | 5 | 98.6 | 123.9 | 131.1 | 0.262 | 0.223 | 518.5 | 21.2 | 59.1 |
| Example 12 | | | 10 | 97.2 | 134.8 | 145.4 | 0.262 | 0.223 | 523.0 | 21.9 | 69.4 |

Examples 1 to 5 and Comparative Examples 1 to 2 each include Fluorescent Material A as the first fluorescent material. Except for Comparative Example 1, Fluorescent Material B, or the β sialon fluorescent material, is included as the second fluorescent material. As shown in Table 3 and FIG. 4, the light-emitting devices of Examples 1 to 4 have a λp Green at around 517 nm, a relative emission intensity at 500 nm of 35% or less, and a relative emission intensity at 540 nm of 65% or less. Thus, the amounts of the blue-green component at around 500 nm and the yellow-green component at around 540 nm are small. For each light-emitting device, the color reproduction range according to BT. 2020 and the luminance of a liquid crystal display including the device with the predetermined color filters were obtained. Regarding the color reproduction range, the liquid crystal displays each including one of the light-emitting devices of Examples are about the same. Regarding luminance, Example 4 is higher than Comparative Example 1 by about 20%. In Comparative Examples 2, the amount of the component at 500 nm is small, whereas the relative emission intensity at 540 nm is greater than 70%. Also, the ratio of the β sialon fluorescent material is greater than 5% by weight. Although Comparative Examples 2 are more luminous than Comparative Example 1, there is a large drop in the value of color reproduction range, indicating that their color reproduction ranges are narrow.

Examples 6 and 7 and Comparative Examples 3 to 5 include Fluorescent Material A as the first fluorescent material, and Fluorescent Material C, i.e., the chlorosilicate fluorescent material, as the second fluorescent material. As shown in Table 3 and FIG. 5, the light-emitting devices of Examples 6 and 7 each have a λp Green at around 516.5 nm, a relative emission intensity at 500 nm of 35% or less, and a relative emission intensity at 540 nm of 65% or less. In contrast, Comparative Examples 3 to 5 have a relative emission intensity at 500 nm of higher than 35%, and Comparative Example 5 has a relative emission intensity at 540 nm of higher than 65%. The color reproduction ranges of Examples 6 and 7 are approximately the same as the color reproduction range of Comparative Example 1, and Example 7 has a luminance higher by 24%. Although Comparative Examples 3 to 5 are luminous, their color reproduction ranges are narrow.

Example 8 and Comparative Examples 6 to 8 include Fluorescent Material A as the first fluorescent material, and Fluorescent Material D, i.e., the SGS fluorescent material, as the second fluorescent material. As shown in Table 3 and FIG. 6, the light-emitting device of Example 8 has a λp Green at about 518 nm, a relative emission intensity at 500 nm of 35% or less, and a relative emission intensity at 540 nm of 65% or less. In contrast, although Comparative Examples 6 to 8 each have a low relative emission intensity at 500 nm, Comparative Examples 6 to 8 have a high relative emission intensity at 540 nm. Example 8 has about the same color reproduction range as the color reproduction range of Comparative Example 1, but has a luminance higher by 26%. Comparative Examples 6 to 8 have narrow color reproduction ranges.

Examples 9 to 12 and Comparative Examples 9 include Fluorescent Material A2 as the first fluorescent material. Except for Comparative Example 10, Fluorescent Material B, or the β sialon fluorescent material, is included as the second fluorescent material. As shown in Table 3 and FIG. 7, the light-emitting devices of Examples 9 to 11 have a λp Green at around 518 nm, a relative emission intensity at 500 nm of 35% or less, and a relative emission intensity at 540 nm of 60% or less. Examples 9 to 12 have color reproduction ranges approximately the same as the color reproduction range of Comparative Example 9, and Example 11 has a luminance higher by 24%.

As described above, using the second fluorescent material in addition to the first fluorescent material as the green light-emitting fluorescent material, and adjusting the emission spectrum in the green region to have a predetermined shape enables wide color reproduction range and high luminance.

The light-emitting device according to an embodiment of the present invention including a light emission diode as an excitation light source can be used in various fields including the fields of display light sources, backlight light sources, general lighting, and in-vehicle lighting. The light-emitting device according to an embodiment of the present invention has an improved color reproducibility, and can be suitably used as a backlight light source for a liquid crystal display, such as a monitor or a smart phone, that is required to reproduce deep and clear colors of RGB.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

Although the present disclosure has been described with reference to several exemplary embodiments, it is to be understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular examples, means, and embodiments, the disclosure may be not intended to be limited to the particulars disclosed; rather the disclosure extends to all functionally equivalent structures, methods, and uses such as are within the scope of the appended claims.

One or more examples or embodiments of the disclosure may be referred to herein, individually and/or collectively, by the term "disclosure" merely for convenience and without intending to voluntarily limit the scope of this application to any particular disclosure or inventive concept. Moreover, although specific examples and embodiments have been illustrated and described herein, it should be appreciated that any subsequent arrangement designed to achieve the same or similar purpose may be substituted for the specific examples or embodiments shown. This disclosure may be intended to cover any and all subsequent adaptations or variations of various examples and embodiments. Combinations of the above examples and embodiments, and other examples and embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure may be not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter shall be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure may be determined by the broadest permissible interpretation of the following claims and their equivalents, and shall not be restricted or limited by the foregoing detailed description.

All publications, patent applications, and technical standards mentioned in this specification are herein incorporated by reference to the same extent as if each individual publication, patent application, or technical standard was specifically and individually indicated to be incorporated by reference.

What is claimed is:

1. A light-emitting device comprising:
   a light-emitting element having a peak emission wavelength in a range of from 400 nm to 470 nm; and
   a fluorescent member including
   a first fluorescent material containing an aluminate that contains Mg, Mn, and at least one alkali earth metal selected from the group consisting of Ba, Sr, and Ca, and has a peak emission wavelength in a range of from 510 nm to 525 nm,
   a second fluorescent material having a different composition from the first fluorescent material, and a peak emission wavelength in a range of from 510 nm to 550 nm, and
   a third fluorescent material having a peak emission wavelength in a range of from 620 nm to 670 nm,
   wherein
   the second fluorescent material contains at least one material selected from the group consisting of β sialon fluorescent materials, silicate fluorescent materials, and sulfide fluorescent materials, and
   the third fluorescent material contains at least one material selected from the group consisting of fluoride fluorescent materials, magnesium fluoro-germanate fluorescent materials, nitride fluorescent materials, and sulfide fluorescent materials.

2. The light-emitting device according to claim 1, wherein the first fluorescent material has a composition represented by formula (I):

$$X^1_p Eu_u Mg_q Mn_r Al_s O_{p+t+q+r+1.5s} \quad (I)$$

wherein $X^1$ is at least one selected from the group consisting of Ba, Sr, and Ca; and p, q, r, s and t satisfy $0.5 \le p \le 1$, $0 \le q \le 0.7$, $0.2 \le r \le 0.7$, $8.5 \le s \le 13$, $0 \le t \le 0.5$, $0.5 \le p+t \le 1.2$, and $0.2 \le q+r \le 1$.

3. The light-emitting device according to claim 2, wherein $X^1$ contains Ba, and p satisfies $0.6 \le p \le 1$ in the formula (I).

4. The light-emitting device according to claim 2, wherein r satisfies $0.3 \le r \le 0.6$ in the formula (I).

5. The light-emitting device according to claim 1, wherein the second fluorescent material contains at least one selected from the group consisting of fluorescent materials having a composition represented by any of formulas (IIa) to (IId) below:

$$Si_{6-z}Al_zO_zN_{8-z}:Eu, \quad 0 \le z \le 4.2 \quad (IIa)$$

$$(Ca,Sr)_8MgSi_4O_{16}(Cr,F,Br)_2:Eu \quad (IIb)$$

$$(Sr,Ca,Ba)Ga_2S_4:Eu \quad (IIc)$$

$$(Ba,Sr,Ca)_2SiO_4:Eu \quad (IId).$$

6. The light-emitting device according to claim 5, wherein the second fluorescent material has a composition represented by the formula (IIa), and has a content ratio of 20% or less by weight relative to a total amount of the first fluorescent material and the second fluorescent material contained in the fluorescent member.

7. The light-emitting device according to claim 5, wherein the second fluorescent material has a composition represented by the formula (IIb) or (IId), and the second fluorescent material has a content ratio of less than 1% by weight relative to a total amount of the first fluorescent material and the second fluorescent material contained in the fluorescent member.

8. The light-emitting device according to claim 5, wherein the second fluorescent material has a composition represented by the formula (IIc), and the second fluorescent material has a content ratio of less than 0.5% by weight relative to a total amount of the first fluorescent material and the second fluorescent material contained in the fluorescent member.

9. The light-emitting device according to claim 1, wherein the third fluorescent material contains at least one material selected from the group consisting of fluorescent materials having a composition represented by any one of formulas (IIIa) to (IIIe) below:

$$K_2(Si,Ge,Ti)F_6:Mn \quad (IIIa),$$

$$3.5MgO \cdot 0.5MgF_2GeO_2:Mn \quad (IIIb)$$

$$(Sr,Ca)AlSiN_3:Eu \quad (IIIc)$$

$$(Sr,Ca)LiAl_3N_4:Eu \quad (IIId)$$

$$(Ca,Sr)S:Eu \quad (IIIe)$$

10. The light-emitting device according to claim 1, wherein the second fluorescent material has a longer peak emission wavelength than the first fluorescent material.

11. The light-emitting device according to claim 1, emitting light in a range of x from 0.22 to 0.34 and y from 0.16 to 0.34 in CIE 1931 xy chromaticity coordinates.

* * * * *